United States Patent [19]

Rotzoll

[11] Patent Number: 5,739,730
[45] Date of Patent: Apr. 14, 1998

[54] VOLTAGE CONTROLLED OSCILLATOR BAND SWITCHING TECHNIQUE

[75] Inventor: Robert Rudolf Rotzoll, Allen, Tex.

[73] Assignee: Microtune, Inc., Plano, Tex.

[21] Appl. No.: 577,174

[22] Filed: Dec. 22, 1995

[51] Int. Cl.⁶ .................... H03B 5/08; H03J 5/24
[52] U.S. Cl. .................. 331/177 V; 331/179; 334/15
[58] Field of Search ............... 331/36 C, 177 V, 331/179; 334/15

[56] References Cited

U.S. PATENT DOCUMENTS

| | | | |
|---|---|---|---|
| 3,538,450 | 11/1970 | Andrea et al. | 331/177 V |
| 3,611,154 | 10/1971 | Kupfer | 455/180.1 |
| 3,631,364 | 12/1971 | Schlib et al. | 332/136 |
| 3,909,748 | 9/1975 | Yuan et al. | 331/117 R |
| 4,353,038 | 10/1982 | Rose et al. | 331/36 C |
| 4,442,415 | 4/1984 | Ashida | 332/136 |
| 4,450,416 | 5/1984 | Mears | 331/117 FE |
| 4,536,724 | 8/1985 | Hasegawa et al. | 331/117 V |
| 4,638,264 | 1/1987 | Ueno | 331/117 D |
| 4,827,226 | 5/1989 | Connell | 331/177 V |
| 4,939,481 | 7/1990 | DaSilva | 331/117 R |
| 4,999,589 | 3/1991 | DaSilva | 331/117 R |
| 5,434,543 | 7/1995 | Brilka et al. | 331/117 R |
| 5,548,252 | 8/1996 | Watanabe et al. | 331/177 V |

*Primary Examiner*—Siegfried H. Grimm
*Attorney, Agent, or Firm*—Fulbright & Jaworski L.L.P.

[57] ABSTRACT

A band switchable resonant circuit for a voltage controlled oscillator has an inductive component in parallel with a plurality of varactor diodes. Some of the varactor diodes are selectively switchable to control the frequency range of circuit operation.

46 Claims, 4 Drawing Sheets

VOLTAGE CONTROLLED OSCILLATOR BAND SWITCHING TECHNIQUE

RELATED APPLICATION

This application is related to Ser. No. 08/579,069, now U.S. Pat. No. 5,648,744, SYSTEM AND METHOD FOR VOLTAGE CONTROLLED OSCILLATOR AUTOMATIC BAND SELECTION, filed concurrently with this application and hereby incorporated by reference herein. These applications are commonly assigned.

TECHNICAL FIELD OF THE INVENTION

This invention relates to voltage controlled oscillators, and more specifically, to oscillators that use phase lock loops and frequency synthesizers.

BACKGROUND OF THE INVENTION

Building a voltage controlled oscillator (VCO) that has a wide operating frequency range creates a problem, in that a wide frequency range requires a large voltage change applied on a varactor diode. A varactor diode is used in combination with an inductor to define the operating frequency of the VCO. In order to obtain a large change in the capacitance of the diode, a large variation of applied voltage is required. The difficulty with integrating such a device is that only a limited voltage range is available in integrated circuit diodes.

Another goal is to have a wide operating frequency range of the VCO, while low phase noise conditions are maintained. A problem arises when a single diode and a single inductor are used in a VCO, which can result in large noise inputs into the VCO which are then translated into large frequency errors. Because the phase noise of the oscillations is related to the input noise, it is desirable to limit how wide a frequency range a VCO has. One solution to this problem is to band switch the oscillator, which involves having narrow operation frequency bands that are available with the same varactor diode.

The band switching technique is well known in the prior art, typically, and it is done using additional capacitors in the circuit. The capacitors are placed either in parallel or in series with the varactor diode. The different arrangements modify the total capacitance available in the inductance/capacitance (L/C) tank circuit. However, one problem with this technique is that the varactor diode capacitance range becomes a smaller percentage of the total capacitance range of all of the capacitors combined. This causes a variation in the frequency range for the varactor diode in any selected band, in that the same maximum frequency range from the oscillator is not achieved for a band that has low frequencies when compared to a band that has high frequencies. Also, the additional capacitors cause a change in linearity of the circuit, as well as a change in the available frequency range. The transfer function of the VCO becomes more linear as the additional capacitors increase in value when compared to the capacitance size of the varactor diode.

Another problem is that because of nonlinearity concerns, the applied voltage to the varactor diode itself would vary over much greater ranges for an integrated application. This is contrary to the goal of limiting the voltage that is applied to the varactor diode. Other analog circuits that are tied to the oscillator and drive the input voltage typically are rated to a certain voltage range, which should be kept as large as possible in order to minimize noise impact. In the prior art, generally band switching was accomplished by placing capacitors in parallel with some type of inactive or electronic circuit switch, such as a rectifying diode. A switching diode, or a MOS transistor could be used to add the capacitors.

Another technique that is used to handle the problem of nonlinearity of the VCO, is to modify the input control voltage via a compensation circuit. The compensation circuit predistorts the input voltage to the VCO, so as to make the transfer function from the input voltage to the output frequency linear. However, the problem with this technique is that it also requires the varactor diode to have large voltages applied to it in an effort to linearize the operating transfer function.

Therefore, a VCO should not only have a broad frequency range, but also maintain a low gain in terms of the amount of output frequency variation of the output which occurs compared to the input voltage variation.

Another goal is to keep the VCO gain as low as possible, so as to minimize the amount of noise transferred through the VCO, which becomes phase noise.

Also, it is desired to have a linear transfer function of the input voltage to the VCO versus the output frequency. Furthermore, all of the individual frequency bands in the VCO should be approximately equal widths. In other words, the relationship between the loop gain of the VCO output frequency and the input voltage variation should remain constant. This is necessary for the phase lock loop performance to remain uniform across the operating spectrum.

It is, therefore, an object of the present invention to provide a voltage controlled oscillator band switching technique that limits the frequency range of any given selected frequency band so that a minimum amount of phase noise is created due to the input voltage noise on the VCO.

Yet another object of the present invention is to provide a voltage controlled oscillator band switching technique that simplifies the design of the switches, so that the diode is not required to be biased with the voltage, and the capacitors would not require biasing.

A still further object of the present invention is to provide a voltage controlled oscillator band switching technique that produces a linear transfer function of the VCO for the input voltage versus the output frequency.

SUMMARY OF THE INVENTION

In accordance with the present invention, a voltage controlled oscillator band switching technique is provided.

Instead of using fixed capacitors in parallel with the primary varactor diode, other diodes are placed in parallel with it. The varactor diode presents an appropriate amount of capacitance variation compared to the input voltage, which produces an acceptable output frequency variation. By switching in parallel diodes that have similar characteristics, the linearity of the voltage controlled oscillator does not vary from one band to the next. The single varactor diode by itself gives the highest operating frequency. For each additional diode that is added, the operating frequency range of the VCO drops down to a lower range.

A digital control of some type, either transistors or switching diodes, selects the number of diodes that get added to the circuit. This technique insures that the VCO gain remains constant regardless of how many of the diodes are switched in parallel. Thus, the amount of output frequency variation versus the input voltage variation for each band is identical to all other bands that are possible in that VCO. Also, the frequency range is increased by using the band switching technique. However, for any given band, the amount of frequency variation is relatively small.

It is therefore one technical advantage of the invention to provide a band switching technique that is simplified because the same voltage that is applied to the primary varactor diode is also applied by the switches to the additional diodes that are added in parallel to the primary one.

It is a further technical advantage of the present invention to provide a band switching technique such that the total frequency range available from the VCO is large, and that for each band that is selected, the gain of the VCO, which is the output frequency variation versus the input voltage variation, remains constant regardless of which band is selected.

Thus, in accordance with one aspect of the present invention, there is provided a voltage controlled oscillator band switching technique system which generates an input voltage signal and converts this input voltage signal into an output RF signal. Preferably, the input voltage is generated by an oscillator active circuit and one conversion is by a circuit which is a resonant inductor-capacitor circuit.

Preferably, the resonant inductor-capacitor circuit includes a number of switches connected in parallel to the input voltage signal which controls the number of junction diodes connected across an inductor.

In accordance with another aspect of the present invention, there is provided a method for converting an input voltage signal into an output RF signal, comprising the steps of receiving an input voltage signal from a first circuit means; processing the input voltage signal to create a first voltage signal; and applying the first voltage signal to an inductor to generate an output RF signal.

Preferably, the step of processing the input voltage signal to create the first voltage signal further comprises applying the input voltage signal to a capacitance to generate a first voltage signal. Preferably, the capacitance includes a plurality of first junction diodes in parallel to each other, with each first junction diode connected in series to each of a plurality of switches, which operate to change the total capacitance of the circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

Before beginning a discussion of the invention, it may be well to review the prior art with respect to FIGS. 4–10.

Figure 4:
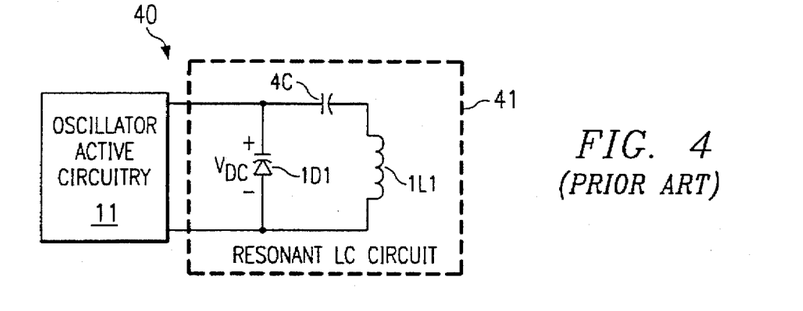
FIG. 4 is a schematic representation of the basic voltage controlled oscillator from the prior art.

In FIG. 4, circuit 40 shows a VCO of the prior art. Block 11 is the oscillator active circuitry. This contains the majority of the oscillator with the exception of the resonant tank circuit 41, which contains inductor 1L1, coupling capacitor 4C, and varactor diode 1D1. Coupling capacitor 4C is used to keep DC voltages from inductor 1L1. In varactor diode 1D1, the capacitance is optimized when it is varied by the applied voltage across the diode 1D1. In circuit 40, the VCO frequency is defined by the capacitance of varactor diode 1D1 in combination with the inductance of inductor 1L1. The range of operating frequencies of circuit 40 are defined by the maximum voltage that can be applied to varactor diode 1D1, which causes its capacitance to change. If a large frequency range is desired, than a small disturbance of the input voltage, such as noise, will be transferred through the VCO, and therefore, create a phase noise in the operating frequency of the oscillator. Also, this voltage controlled oscillator circuit 40 is difficult to integrate, because typically, the varactor diode 1D1 cannot be supplied with a large voltage.

Figure 5:
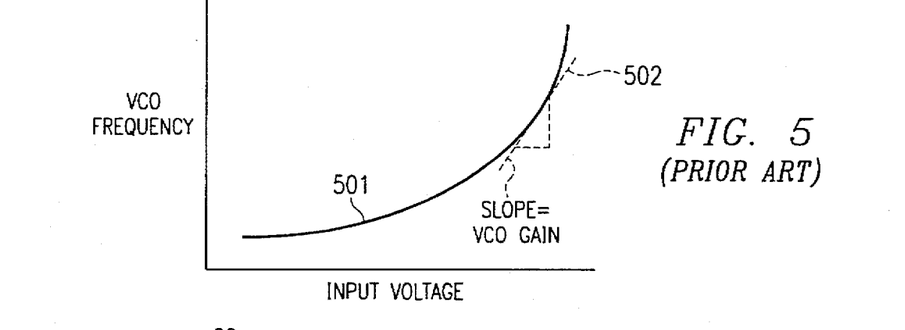
FIG. 5 is a graphical representation of a voltage controlled oscillator from the prior art showing input voltage versus output frequency.

FIG. 5 shows the change of the operating frequency of the VCO versus the input voltage. The VCO frequency varies in a nonlinear manner as shown by curve 501. The slope 502 of curve 501 varies with the input voltage. The VCO output frequency at the high input voltage tends to vary relatively quickly, when compared to the low input voltage, which varies more slowly. This creates an undesirable condition in a typical phase lock loop or frequency synthesizer application in which it is desirable to have the VCO gain remain constant.

Figure 6:
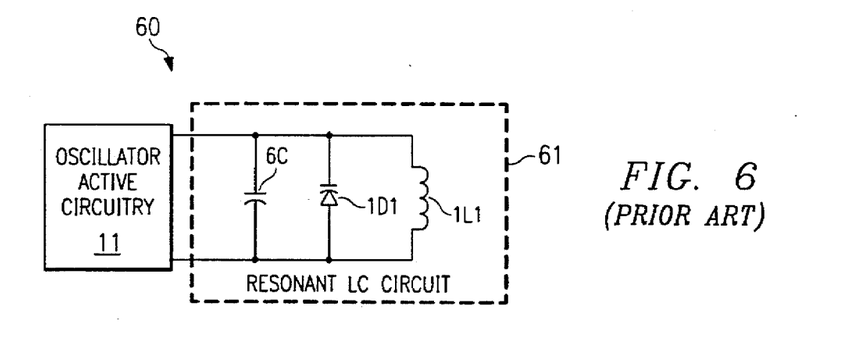
FIG. 6 is a schematic representation of a voltage controlled oscillator from the prior art with reduced gain via a parallel capacitor.

FIG. 6, which shows circuit 60, contains oscillator active circuit 11, as well as resonant tank circuit 61, which includes inductor 1L1, varactor diode 1D1, and an additional capacitor 6C. Capacitor 6C is used in parallel with varactor diode 1D1 to increase the effective capacitance of resonant tank circuit 61. This increase in capacitance decreases the operating frequency of the circuit 60, and also causes the variation of the total capacitance to decrease, since a minimum capacitance from capacitor 6C is always in parallel with varactor diode 1D1. A secondary effect is that because the variation of capacitance has been reduced relative to the total capacitance, the variation is somewhat more linear when compared to the original varactor diode 1D1 alone. A problem with circuit 60 is that the range of operating frequencies has been reduced because the capacitance variation is now smaller.

Figure 7:
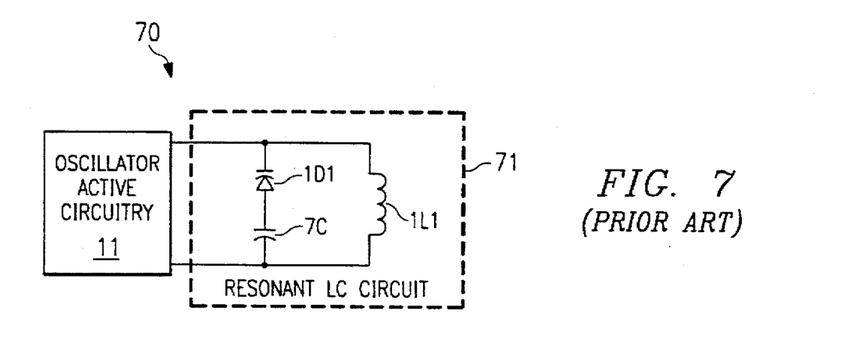
FIG. 7 is a schematic representation of a voltage controlled oscillator from the prior art with reduced gain via a series capacitor.

FIG. 7 shows circuit 70, which also contains oscillator active circuit 11, and a new tank circuit 71, which includes inductor 1L1, varactor diode 1D1, and additional capacitor 7C. Capacitor 7C increases the operating frequency of the resonant LC circuit by dividing the amount of capacitance available in circuit 70. However, the frequency range has also been reduced, in that a larger swing of voltage on varactor diode 1D1 has less of an effect on the total capacitance. The performance of circuit 70 is the complement of that performance of circuit 60.

Figure 8:
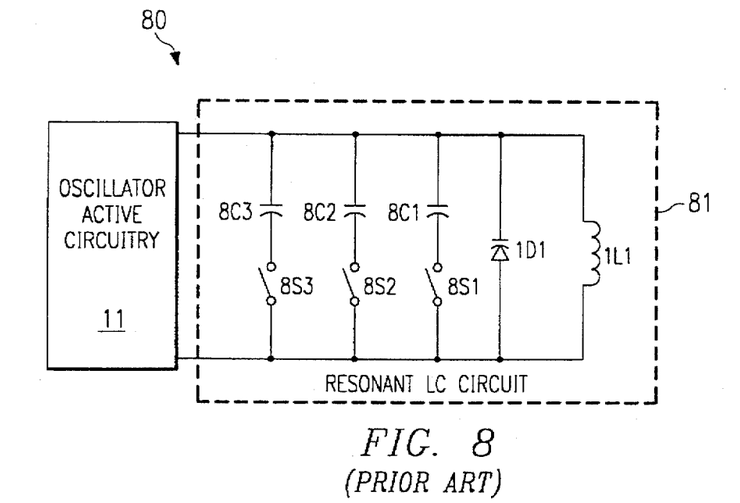
FIG. 8 is a schematic representation of a voltage controlled oscillator from the prior art with capacitance band switching.

FIG. 8 shows circuit 80, which contains oscillator active circuit 11, as well as another variation on tank circuit 81. Tank circuit 81 contains inductor 1L1, varactor diode 1D1, capacitors 8C1, 8C2 and 8C3, as well as switches 8S1, 8S2 and 8S3. The purpose of the switches 8S1, 8S2, and 8S3 is to create additional capacitance beyond that provided by the varactor diode 1D1. When switch 8S1 is closed, capacitor 8C1 is placed in parallel with varactor diode 1D1, which therefore increases the total amount of capacitance available to circuit 80, and simultaneously decreases the range of capacitance generated by voltage variation on varactor diode 1D1. This limits the frequency range of circuit 81. If switches 8S1 and 8S2 are both closed simultaneously, capacitors 8C1 and 8C2 are placed in parallel with varactor diode 1D1, which further increases the capacitance available in tank circuit 81, as well as further decreases the operating frequency of tank circuit 81, and the total effect of variation of capacitance of varactor diode 1D1. This, in turn, makes the frequency variation of circuit 80 smaller than if switch 8S2 were not closed.

Figure 9:
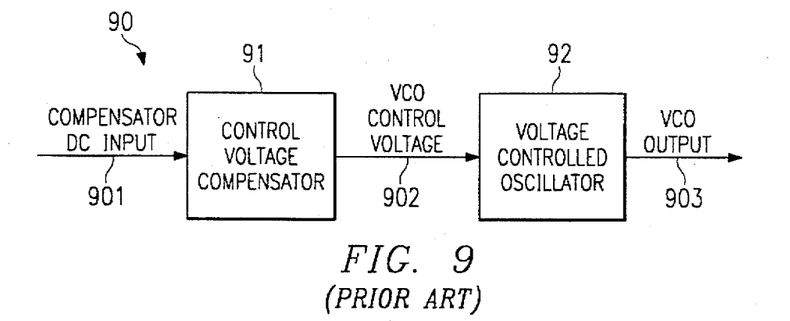
FIG. 9 is a schematic representation of a VCO control voltage compensation system from the prior art.

FIG. 9 contains controlled voltage compensator 91, voltage controlled oscillator 92, and circuit 90. The input to the controlled voltage compensator 91 is a modified control voltage for the input to the VCO. Control voltage 902, which has now been modified to correct for variation in gain in the voltage controlled oscillator, controls the VCO directly. VCO output 903 is the output frequency to circuit 90.

Figure 10:
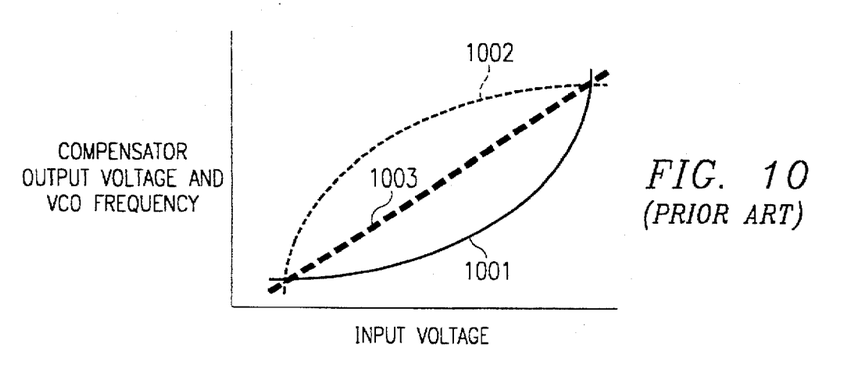
FIG. 10 is a graphical representation of the control voltage compensated voltage controlled oscillator transfer function showing input voltage versus compensator output voltage and voltage controlled oscillator output frequency.

The performance of circuit 90 is explained in FIG. 10 in terms of the nonlinearity of the VCO. The VCO curve 1001 in FIG. 10 shows that the VCO output frequency varies tremendously for small input voltage variations at higher output frequencies. Compensator 91 applies curve 1002 to the input voltage which is now applied as signal 902 to the VCO, with the resulting curve 1003 of the VCO defined as the VCO output 903 versus the compensator 91 DC input 901, which is shown as curve 1003 in FIG. 10. This produces a more linear transfer function of the input voltage versus output frequency. However, this method of linearization introduces additional noise since the controlled voltage compensator 91 has several active elements, or possibly even passive elements, which introduce noise. Because this method adds additional noise to the voltage controlled oscillator, it is an undesirable scheme for correction of nonlinearity.

Figure 1:
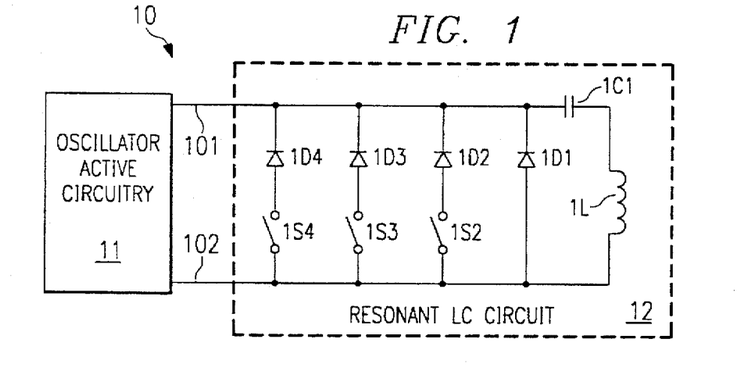
FIG. 1 is a schematic representation of a voltage controlled oscillator with varactor diode band switching.

FIG. 1 shows one preferred embodiment of the present invention. Circuit 10 is a voltage controlled oscillator (VCO) comprised of oscillator active circuit 11, and resonant tank circuit 12, which defines the operating frequency of the VCO. Resonant tank circuit 12 is comprised of inductor 1L, capacitor 1C1, and varactor diodes 1D1, 1D2, 1D3, and 1D4. It also contains switches 1S2, 1S3 and 1S4. Switches 1S2, 1S3 and 1S4 connect, and can enable diodes 1D2, 1D3 and 1D4 in tank circuit 12 under a digital control signal. The performance of varactor diode 1D1, in combination with inductor 1L, defines the highest possible operating frequency of the VCO. As voltage is varied across varactor diode 1D1, a change occurs in the output frequency. If switch 1S2 is also closed, diodes 1D1 and 1D2 are now placed in parallel in the circuit 12. Therefore, diodes 1D1 and 1D2 simultaneously affect the output frequency of the VCO. If switch 1S3 is now closed, diode 1D3 is also placed in parallel. In the preferred embodiment, with the addition of each parallel diode 1D2, 1D3 and 1D4, the frequency of operation of the VCO will decrease by an amount related to the effective capacitance in the diodes 1D2, 1D3, and 1D4 which are placed in parallel.

Signals 101 and 102 are the connection between the oscillator active circuitry 11 and the resonant LC circuit 12. These produce the AC wave form that is fed into the resonant LC circuit 12 that then produces the output frequency of the oscillator.

Capacitor 1C1 is used to block the DC signal which is applied to the diodes 1D1, 1D2, 1D3, and 1D4, from being placed across inductor 1L. The gain of the VCO in circuit 10 will remain constant with regard to the applied input voltage versus the output frequency of the VCO. This is because the diodes 1D1, 1D2, 1D3, and 1D4 are all of similar performance and therefore, the linear effect of paralleling the capacitors produces a frequency variation which is identical between the bands selected by switches 1S2, 1S3 and 1S4.

The frequency variation of the output of the oscillator when compared to the input voltage is relatively linear because the variation of the voltage applied to the diodes 1D1, 1D2, 1D3, and 1D4 is small. Each of the diodes 1D1, 1D2, 1D3, and 1D4 receive a small percentage of the total voltage change when compared to a normal varactor diode in a nonintegrated situation. Because the variation is so small, the gain then remains relatively constant versus the variation in input voltage. Another advantage is that as the additional diodes 1D2, 1D3, and 1D4 are added to the circuit 12, the frequency of operation does decrease. However, the relative gain of the VCO, which is the variation in output frequency compared to the variation of input voltage, remains constant since diodes 1D2, 1D3 and 1D4 are all of similar performance. Also, because the band switching via switches 1S2, 1S3, and 1S4 selects different narrow frequency ranges, the noise impact from any input noise is reduced, since there is now a small output frequency variation due to the variation of the input voltage. Therefore, circuit 10 is less sensitive to input noise.

The additional junction varactor diodes 1D2, 1D3, and 1D4 are easily constructed on an integrated circuit, as is varactor diode 1D1. They are inexpensive to add to circuit 12, and as in the case of many processes, an explicit fixed capacitor for use in parallel with the varactor diode may not be available. In virtually all processes that have a junction diode used as a varactor diode, parallel junction diodes are easy to implement and are consistent with standard integrated circuit processing. Also, the cost of the additional diodes is small relative to the total cost of the average integrated circuit.

Typically in standard processing, the voltage range applied to diodes 1D1, 1D2, 1D3 and 1D4 on an integrated circuit would be between zero and 5 V. However, in certain processes, it might be larger, or even possibly reduced to 3 V. The standard varactor diodes used in the prior art have ranges of approximately 30 V. Therefore, the reduction in voltage range is dramatic. This range reduction is important not only from the desire to linearize the circuit by applying a smaller voltage, but also because most modern integrated circuit processes cannot support a large voltage across the diode.

Figure 1A:
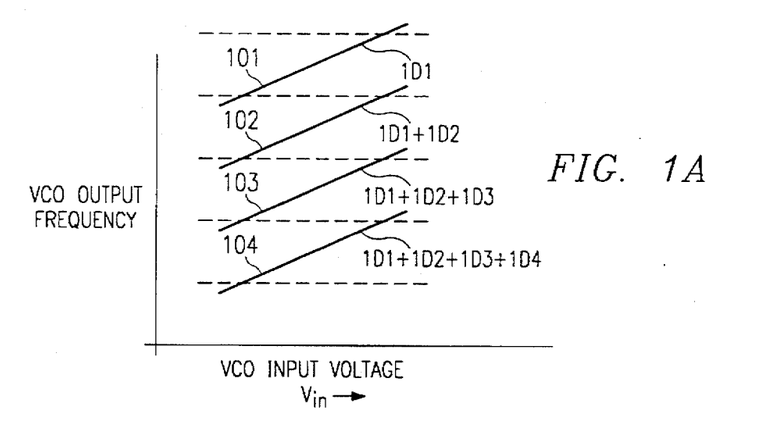
FIG. 1A is a graphical representation of the voltage controlled oscillator input voltage versus the output frequency.

FIG. 1A shows the transfer function for VCO Circuit 10. The VCO output frequency is plotted versus the VCO input voltage for different conditions of switches 1S1, 1S2, 1S3 and 1S4 being closed. Curve 101 is the transfer function of the VCO for the case where none of switches 1S1, 1S2, 1S3 and 1S4 are closed. Curve 102 shows the VCO transfer function when switch 1S2 is closed. While the frequency has now been reduced, the gain of the VCO has remained constant and is identical to curve 101, only with a lower operating frequency. Closing switches 1S2 and 1S3 yields curve 103 which again lowers the operating frequency for the VCO, but has the same gain as in curves 101 and 102. Finally, closing switches 1S2, 1S3 and 1S4 yields curve 104, which has an even lower operating frequency than the previous curves, but has the same gain as the previous curves. Note also, that while only four diodes are shown, circuit 10 could work with any number of diodes, and perhaps in some situations, the diodes could have different voltage ranges, and therefore can be switched in by various combinations of switches. This gives a wide range of control for the switches 1S2, 1S3 and 1S4, which need not be in sequential fashion. This control could be done in binary or any other method in order to yield a wide range of possibilities, particularly when the capacitance and voltage range of each diode are different.

Figure 2:
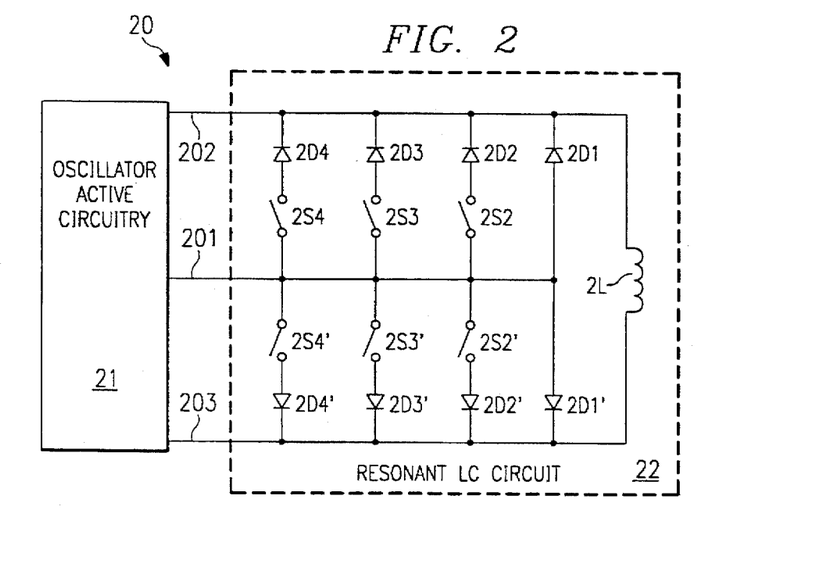
FIG. 2 is a schematic representation of a differential voltage controlled oscillator with varactor diode band switching.

FIG. 2, shows another preferred embodiment of the present invention. Circuit 20 is the differential implementation of the voltage controlled oscillator. Block 21 is the oscillator active circuitry which contains the differential oscillator element. Circuit 22 is a differential implementation of a resonant LC tank circuit. The resonant LC tank circuit 22 with its combination of capacitance and inductance will resonate at a given operating frequency. Inductor 2L is contained inside circuit 22, as well as diodes 2D1, 2D2, 2D3, 2D4, 2D1', 2D2', 2D3' and 2D4', as well as switches 2S2, 2S3, 2S4, 2S2', 2S3' and 2S4'. The effect of diodes 2D1 and 2D1' is to vary the capacitance of those diodes with respect to the input voltage. As the voltage is varied, the capacitance varies, therefore the operating frequency of the tank circuit as built via diodes 2D1 and 2D1' and inductor 2L will vary.

One of the purposes of adding diode 2D1' was to remove the coupling capacitor that would normally be used with inductor 2L. This capacitance would be used to block a DC voltage to the inductor 2L. The configuration of diodes 2D1 and 2D1' is such that the control voltage is applied to the connection between the two, and the connections to the inductor 2L now are at the same DC voltage, although they are always going to be at opposing AC voltages. A secondary advantage of having a differential implementation with regard to an integrated circuit is that the amount of coupling noise into the substrate of the integrated circuit is dramatically reduced by using a differential implementation of the resonant LC circuit 22.

Circuit 20 is the preferred embodiment for a case of using an integrated circuit which has many other analog components. This is because the signals generated by circuit 20 are less likely to couple into the other analog circuits which are available on the same integrated circuit via the substrate of the integrated circuit. Circuit 10 is the preferred embodiment for an integrated circuit whose sole purpose is to be a voltage controlled oscillator, or perhaps, in an implementation that is not integrated.

Figure 3:
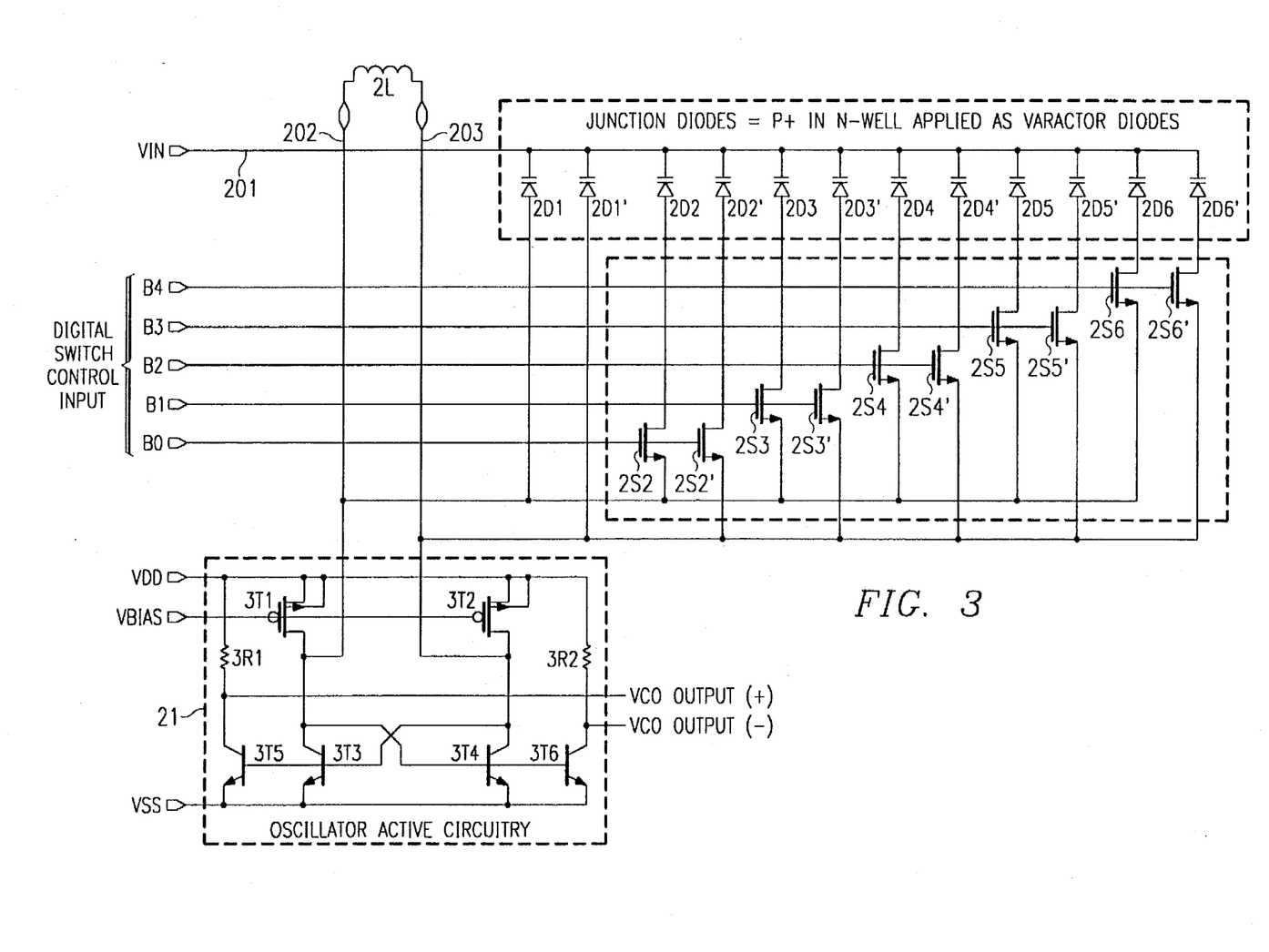
FIG. 3 is a schematic representation of the best mode of the differential voltage controlled oscillator band switching technique.

FIG. 3 shows the best mode contemplated for circuit 20 of FIG. 2. In FIG. 3, switches 2S2 through 2S6' comprise end channel MOS field effect transistors, which are applied as switches in the sense that when one of the digital switch control inputs has a high voltage applied to it, the transistor will then create a low resistance between the source and the drain regions of that device. Typically, these switches have dimensions of widths of 2 microns, lengths of 800 nanometers, and a multiplicity of 1.

Diodes 2D through 2D6' in this embodiment are the junction diodes which are configured as the varactor diodes in the voltage controlled oscillator. They comprise PN junctions, which are each defined as a P+ diffusion in a N well region of an integrated circuit process.

Inputs B0 through B4 are used to control the switches 2S2 through 2S6', and these inputs receive digital logic control signals from internal circuitry. Typically, these are signals from zero to 5 V, which can be switched externally. $V_{IN}$ which is connection 201, ranges from 1 to 4 V.

Typically, oscillator active circuitry 21 would include the power supply $V_{DD}$, which is a positive voltage with respect to power supply $V_{SS}$. The $V_{DD}$ minus $V_{SS}$ level is usually 5 V, however, it can range from 4 to 6 V. Transistors 3T1 and 3T2 are both MOS P channel field effect transistors which are configured to act as current sources under the control of voltage $V_{BIAS}$ and are set to a nominal current, which enables the oscillator circuit. Transistors 3T3 and 3T4 are the core of the oscillator; they utilize a cross-coupled scheme to create a negative resistance, which under the current bias from transistors 3T1 and 3T2 will cause oscillation when tied to the tank circuit defined by inductor 2L and diodes 2D1 through 2D6'. Transistors 3T5 and 3R1 comprise an amplifier, as does transistor 3T6 and 3R2. These amplifiers take the VCO output, and shift the level to one that is close to the $V_{DD}$ signal, and then increase the signal level to a large voltage swing, typically on the order of approximately 800 mV.

The present invention, therefore, is well adapted to carry out the objects and obtain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

Although the present invention and its advantages have been described in detail, it should be understood that various changes, substitutions and alterations can be made herein without departing from the spirit and scope of the invention as defined by the appended claims.

I claim:

1. A band switching resonant circuit for a voltage controlled oscillator, said circuit comprising:
    an inductor connected in series with a capacitor, wherein a single current flows through both said inductor and said capacitor;
    a first diode connected across the series connection of the inductor and the capacitor; and
    at least one other diode selectively switchable across said first diode;

wherein said first diode and said other diode provide voltage controlled variable capacitance.

2. The invention set forth in claim 1 further comprising at least one transistor switch connected to said other diode for switching said other diode into said circuit.

3. The invention set forth in claim 1, wherein:
said first diode is selectively switchably connected across the series connection of the inductor and the capacitor.

4. The invention set forth in claim 1, wherein:
said first diode is fixedly connected across the series connection of the inductor and the capacitor.

5. The invention set forth in claim 1, wherein:
said at least one other diode is a plurality of other diodes, each selectively switchable across said first diode.

6. The invention set forth in claim 1, wherein:
said first diode and said at least one other diode are junction diodes.

7. The invention set forth in claim 1, wherein:
said first diode and said at least one other diode are varactor diodes.

8. A method for controlling the operating frequency of an oscillator, the method comprising the step of:
selecting a frequency band of the oscillator by changing a capacitance of a resonant circuit; and
selecting a frequency in said frequency band by varying the voltage applied to said resonant circuit;
wherein said resonant circuit includes:
a plurality of diodes in parallel to each other, each diode connected in series to one of a plurality of switches, said plurality of diodes operable upon closing of said switches for changing the capacitance of said resonant circuit;
an inductor connected in series to a capacitor, wherein a single current flows through both said inductor and said capacitor, and the series connection of the inductor and the capacitor is connected in parallel to said plurality of diodes;
wherein said diodes provide voltage controlled variable capacitance.

9. The method as set forth in claim 8, wherein said voltage is received from an oscillator active circuit.

10. The method as set forth in claim 9, wherein each of said plurality of switches is a transistor.

11. The method as set forth in claim 8, wherein said resonant circuit further includes:
another diode connected in parallel to said plurality of first diodes.

12. The method as set forth in claim 11, wherein said another diode is fixedly connected in parallel to said plurality of first diodes.

13. The method as set forth in claim 8, wherein one of the plurality of switches is maintained in the closed mode.

14. The invention set forth in claim 8, wherein:
said plurality of diodes are junction diodes.

15. The invention set forth in claim 8, wherein:
said plurality of diodes are varactor diodes.

16. A voltage controlled oscillator (VCO) system having linearity over a wide operating frequency range where the frequency range is determined by a resonant circuit, said resonant circuit comprising:
an impedance circuit formed from a series connection of an inductor and a capacitor, wherein a single current flows through both said inductor and said capacitor;
a first diode connected in parallel with said impedance circuit; and
a plurality of other diodes each switchably connected in parallel with said first diode by a switch in series with each said other diode.

17. The invention set forth in claim 16 wherein each said switch is a semiconductor device and wherein all of said semiconductor devices have similar performance characteristics.

18. The invention set forth in claim 17 wherein all of said semiconductor device switches are constructed on the same substrate.

19. The invention set forth in claim 16 wherein all of said diodes are constructed on the same substrate.

20. The invention set forth in claim 16 wherein the transfer function of VCO input voltage plotted against VCO output frequency has an approximately constant gain for each combination of closed switches, with each gain offset by a certain amount and parallel to the gain for each other combination of switches.

21. The invention set forth in claim 16, wherein:
said first diode is selectively switchably connected across the impedance circuit.

22. The invention set forth in claim 16, wherein:
said first diode is fixedly connected across the impedance circuit.

23. The invention set forth in claim 16, wherein:
said first diode and said plurality of other diodes are junction diodes.

24. The invention set forth in claim 16, wherein:
said first diode and said plurality of other diodes are varactor diodes.

25. A voltage controlled oscillator (VCO) system having linearity over a wide operating frequency range where the frequency range is determined by a differential resonant circuit connected to an oscillator active portion of said VCO, said differential resonant circuit comprising:
an impedance element;
a first pair of diodes in parallel with said impedance element, wherein the anodes of said first pair of diodes are connected to a common lead, and the cathodes of said first pair of diodes are connected to opposing sides of said impedance element; and
at least one other pair of diodes switchably connected in parallel with said first pair of diodes and said impedance element by switches in series with each individual diode of said one other pair of diodes and wherein the anodes of the individual diodes of said other pair of diodes are connected to said common lead and the cathodes of the individual diodes of said other pair of diodes are connected to opposing sides of said impedance element.

26. The invention set forth in claim 25 wherein all of said diodes are constructed on the same substrate.

27. The invention set forth in claim 25 wherein the transfer function of VCO input voltage plotted against VCO output frequency has an approximately constant gain for each combination of closed switches, with each gain offset by a certain amount and parallel to the gain for each other combination of switches.

28. The invention set forth in claim 25, wherein:
said at least one other pair of diodes is a plurality of other pairs of diodes, each pair of diodes selectively switchable across said first pair of diodes by a respective switch in series with each diode of the plurality of other pairs of diodes.

29. The invention set forth in claim 28 wherein each said switch is a semiconductor device and wherein all of said semiconductor devices have similar performance characteristics.

30. The invention set forth in claim 29 wherein all of said semiconductor device switches are constructed on the same substrate.

31. The invention set forth in claim 25, wherein:

said first pair of diodes are selectively switchably connected across the impedance element.

32. The invention set forth in claim 25, wherein:

said first pair of diodes are fixedly connected across the impedance element.

33. The invention set forth in claim 25, wherein:

said first pair of diodes and said at least one other pair of diodes are junction diodes.

34. The invention set forth in claim 25, wherein:

said first pair of diodes and said at least one other pair of diodes are varactor diodes.

35. The invention set forth in claim 25, wherein:

the impedance element is an inductor.

36. A method for controlling the operating frequency of an oscillator, the method comprising the steps of:

selecting a frequency band of the oscillator by changing a capacitance of a resonant circuit; and selecting a frequency in said frequency band by varying the voltage applied to said resonant circuit;

wherein said resonant circuit includes:

an impedance element;

a first pair of diodes in parallel with said impedance element, wherein the anodes of said first pair of diodes are connected to a common lead, and the cathodes of said first pair of diodes are connected to opposing sides of said impedance element; and at least one other pair of diodes switchably connected in parallel with said first pair of diodes and said impedance element by switches in series with each individual diode of said one other pair of diodes and wherein the anodes of the individual diodes of said other pair of diodes are connected to said common lead and the cathodes of the individual diodes of said other pair of diodes are connected to opposing sides of said impedance element;

wherein said at least one other pair of diodes operable upon closing of said switches for changing the capacitance of said resonant circuit; and said diodes provide voltage controlled variable capacitance.

37. The method set forth in claim 36, wherein:

said at least one other pair of diodes is a plurality of other pairs of diodes, each pair of diodes selectively switchable across said first pair of diodes by a respective switch in series with each diode of the plurality of other pairs of diodes.

38. The method set forth in claim 37 wherein each said switch is a semiconductor device and wherein all of said semiconductor devices have similar performance characteristics.

39. The method set forth in claim 38 wherein all of said semiconductor device switches are constructed on the same substrate.

40. The method set forth in claim 36 wherein all of said diodes are constructed on the same substrate.

41. The method set forth in claim 36 wherein the transfer function of VCO input voltage plotted against VCO output frequency has an approximately constant gain for each combination of closed switches, with each gain offset by a certain amount and parallel to the gain for each other combination of switches.

42. The method set forth in claim 36, wherein:

said first pair of diodes are selectively switchably connected across the impedance element.

43. The method set forth in claim 36, wherein:

said first pair of diodes are fixedly connected across the impedance element.

44. The method set forth in claim 36, wherein:

said first pair of diodes and said at least one other pair of diodes are junction diodes.

45. The method set forth in claim 36, wherein:

said first pair of diodes and said at least one other pair of diodes are varactor diodes.

46. The method set forth in claim 36, wherein:

the impedance element is an inductor.

* * * * *